SEMICONDUCTOR CONTACT MEANS

Filed March 30, 1964

INVENTORS:
JOHN N. FRANK,
RONALD A. STOTT,

BY Urban H. Faubion
THEIR ATTORNEY.

3,268,309
SEMICONDUCTOR CONTACT MEANS

John N. Frank, Auburn, N.Y., and Ronald A. Stott, Tucson, Ariz., assignors to General Electric Company, a corporation of New York Filed Mar. 30, 1964, Ser. No. 355,539
3 Claims. (Cl. 29—195)

Figure 1:
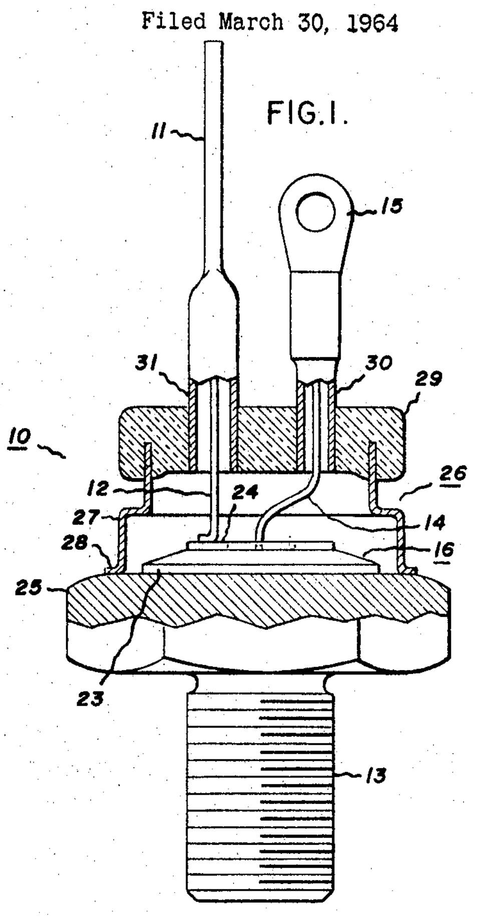

This invention relates to semiconductor devices of the junction type and more particularly to contact structures and means to form conductive connections to semiconductor bodies.

It is recognized that it is extremely important, but difficult, in many semiconductor devices to make electrical contact which provides good electrical and thermal conductivity and good mechanical strength. The problem is particularly acute when contact is to be made to thin diffused heat sensitive layers of semiconductor material (e.g. thin impurity diffused layers) and when location of the contact on the semiconductor surface is critical.

Prior methods of producing contacts on semiconductive bodies include conventional alloying or soldering techniques, pressure contacts with all their inherent drawbacks, plating to metalize the semiconductor and thin solder, plating the semiconductor and heating so that the plating material forms a solder or braze alloy and various arrangements of coating a contact element (sometimes multiple coatings) and then heating the contact element and semiconductive member so that the coating material (or materials) forms a solder or braze. When using conventional alloying or soldering techniques, the elevated temperatures required create problems with cooling stresses and degradation of device junctions. The cooling stress problem may be so severe as to cause pellet fracture. In addition, good wetting and control of contact location is a problem. Where the semiconductive body is metalized and then a solder used to make connections to the device, exact contact location is difficult to control and the elevated temperatures required to form a good joint can be detrimental to device parameters. When the semiconductive body is plated and then heated so that the plating material acts as a solder, degrading elevated temperatures are used and the plating material may react chemically with the semiconductive body unless the plating material is good. When gold is used for this purpose, the amount required to form a good bond makes very expensive contact. For the arrangement where a contact element is plated and then soldered or brazed to the semiconductor body, all the above disadvantges are likely to exist.

It is, therefore, an object of this invention to produce improved electrical contacts to semiconductive bodies.

The invention provides a contact structure for semiconductive bodies which gives good adhesion and contact with shallow penetration, provides accurate location of contact, etch resistance, and low temperature processing.

An improved contact arrangement and means for forming such contacts is described and claimed in the copending patent application Serial No. 346,868, filed in the name of Robert M. Hunter and David A. Fabel, "Semiconductor Contact Means," and assigned to the assignee of the present invention. The present invention takes advantage of the general contact arrangement and method of contact formation of that application but affords an improvement for certain devices.

These and other objects of the invention are attained in accordance with aspects of the invention by providing a multi-layer deposit on the semiconductive body as a contact means. By selection of a combination of metals and thickness and order of layers, penetration and other contact parameters are controlled. In the preferred embodiment described here, the layers comprise nickel, copper and gold.

Figure 2:
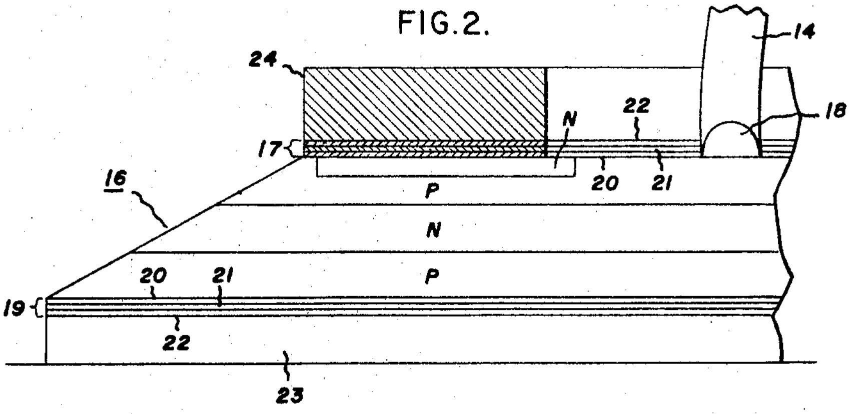

The features which are believed to be characteristic of the invention are set forth with particularity in the appended claims. The invention itself, however, both as to its organization and advantages thereof may best be understood by reference to the following description taken in connection with the accompanying drawings in which:

FIGURE 1 is a central vertical section through a semiconductor controlled rectifier utilizing contacts in accordance with teachings of the present invention; and FIGURE 2 is an enlarged elevational view partially in section of the rectifying element (including connections) of the controlled rectifier of FIGURE 1.

In FIGURE 1 a semiconductor junction type rectifier of the type known as a silicon controlled rectifier is shown mounted in a sealed, self-contained unit or housing which is referred to generally by the reference character 10. The invention is shown and described in this setting because it is applied extensively to these devices and is particularly useful in the device illustrated. The operation of the silicon controlled rectifier illustrated is not described in detail here since a complete understanding of the operation of the device is not essential to an understanding of the invention and, further, the operation of such devices is discussed in a number of other places which are easily accessible. For example, the operation is described in chapter 1 of the General Electric Controlled Rectifier Manual, copyright 1960, by the General Electric Company. For this portion of the description, it should be sufficient to say that the main conduction path through the rectifier unit 10 is between an upper flat lead terminal 11 on the main or cathode conductive lead 12, a lower threaded bolt-like conductive terminal and heat sink 13 through the body of the device. Since current flow through the device takes place from the lower stud 13 through the body of the device to the upper conductive lead 12, the upper conductive lead 12 is frequently considered the device cathode and the lower stud 13 is considered the anode. Conduction does not take place (in any appreciable amount) in the opposite direction and the conduction which does take place is controlled in accordance with the characteristics of the device by a current (called a gate current) supplied to the rectifier through a gate lead 14 that extends out the top of the housing 29 adjacent to the cathode lead 12. The gate lead 14 is also provided with a flat conductive terminal 15 at its upper end.

The active control element of the device, that is, the part of the device which provides the rectifying and control action is the disc-shaped rectifying semiconductor pellet 16 (best seen in FIGURE 2) which is an element in the main conduction path. The semiconductor pellet 16 is a monocrystalline semiconductor material (silicon in the device illustrated) with three junctions between four layers which are of alternate conduction types. That is, the four layers alternately have an excess of free electrons (N-type conduction characteristics) and an excess of positive holes (positive or P-type conduction characteristics). Such a device is described as a P-N-P-N semiconductor switch. The layers of the particular device are all diffused in. The upper N type layer, in the device illustrated, is an annular ring.

In the unit illustrated, the semiconductor pellet is 300 mils in diameter and 7.5 mils thick. The thickness may best be visualized by considering that it is a little thinner than the pieces which would result from slicing a dime edgewise into five pieces of equal thickness. Obviously, such a thin piece of very brittle material is extremely fragile and junction locations are quite critical. The pellet is made even more fragile by the fact that its edge is beveled all the way around its periphery in order to insure that any device breakdown occurs in the bulk of the semiconductor pellet 16 and not across its surface. It is difficult to provide contacts to the device which do not cause undue mechanical strain in the fragile pellet or impair electrical characteristics of the pellet.

In order to meet the critical requirements for low resistance contacts to the semiconductor pellet 16, the present invention incorporates a system of multilayer deposited contacts which makes it possible to take advantage of the properties of several metals. At the same time, the system lends itself to a one cycle pass through a vapor plater and provides a contact which acts as a buffer to reduce transmission of stress from the device conductors (which are connected to the contacts) to the device of pellet 16.

Cathode contact 17 (see FIGURE 2) on the upper side of pellet 16 and anode contact 19 on lower side of the pellet 16 constitute a preferred contact structure and are formed by a preferred method. Since corresponding layers of laminations of each of the contacts 17 and 19 are formed at one time, they are, therefore, given corresponding reference numerals. In the embodiment illustrated here the first layer 20 (the layer on the pellet 16) of each contact is nickel and is approximately 0.05 to 0.01 mil thick, the second layer 21 (middle lamination) is an approximately 0.05 to .013 mil thick copper layer, and the outer layer 22 is gold layer approximately 0.05 to 0.01 mil in thickness.

The preferred method of applying the anode and cathode contacts 17 and 19 is to mask the semiconductor material (either in pellet or wafer form) by conventional masking techniques (e.g., silicon dioxide), to leave exposed regions where these contacts are to be formed. The semiconductor material is loaded in a commercially available vacuum vapor plating device. Charges of the plating metals are also placed in the furnace. The charges are in amounts and are placed at distances from the semiconductor material to be plated so that the plated layers each will be of the desired thickness. Calculations of amounts and placement can be made as taught in L. Holland, Vacuum Deposition of Thin Films, published by John Wiley and Sons, Inc., New York (1956), and many other articles found in CEC Bulletin No. 14–3 entitled "Bibliography on Metal Evaporation and Sputtering," Consolidated Electrodynamics Corporation, Rochester Division, Rochester 3, New York. For the device illustrated, the equipment is loaded with a charge of nickel to provide layer 20 on pellet 16 for contacts 17 and 19, a charge of copper which ultimately forms the middle layer 21, and a charge of gold which forms outer layer 22. The charges are (as is conventional) placed in tungsten filaments which are fired in proper sequence (first nickel, next copper, and then gold) in order to provide the proper sequence of layers on the semiconductor material.

After the contacts 17 and 19 are formed the appropriate leads can be connected to each. As illustrated, the gate lead 14 is connected at contact 18 by ultrasonically welding the lead 14 to the pellet 16. The gate contact 18 is centrally located within the upper annular N type emitter. The thin brittle semiconductor pellet 16 is supported by including it as the central element in a protective sandwich structure (see FIGURE 2). The remainder of the sandwich structure includes a lower disc-shaped backup plate 23 and a tungsten annular ring shaped backup plate 24. These backup plates 23 and 24 form the outer layers of the supporting sandwich structure and form part of the conductive anode and cathode current paths respectively. The backup plates 23 and 24 are preferably of a material which has good thermal and electrical conductivity and a thermal coefficient of expansion which closely matches that of the semiconductor pellet 16. Either tungsten or molybdenum is satisfactory. Both the upper and lower backup plates 23 and 24 are bonded to the pellet 16 by a solder which in the embodiment illustrated may be a gold-germanium eutectic. Although the contact arrangement described here is useful with other solders, it is particularly useful with this solder.

The backup plates 23 and 24 are soldered to the pellet 16 by placing gold-germanium preforms between the backup plates and the pellet and heating the assembly to about 370° C. This temperature is under the nickel-silicon eutectic of around 900° C. so that the nickel of the first layer 20 does not disturb the silicon which is important when bonding to the pellet with thin diffused heat sensitive layers. The constituents of the solder scavenge (and bond well with) the outer gold layer 22 of the contacts but the internal copper layer 21 prevents the solder from disturbing the nickel layer 20 which is adjacent the silicon. This arrangement provides a good mechanical bond and the electrical and heat transferring qualities for such a connection.

The anode contact 19 of the pellet 16 is connected to the copper stud 13 through anode backup plate 23. That is, the sandwich just described is mounted to the anode lead (copper stud 13) by soldering the anode backup plate 23 to the upper surface of an enlarged head or pedestal 25 provided on copper stud 13. The cathode lead 12 is soldered to the upper annular backup plate 24 in order to provide the cathode connection for the device.

In order to provide an hermetic enclosure and at the same time provide external electrical connections to the cathode and gate leads 12 and 14, a header 26 is provided. The header 26 has an essentially cylindrical upstanding metal portion 27 which surrounds inside the device sandwich and is provided with an outwardly extending flange 28 around its lower periphery. The flange 28 is designed to fit on the upper surface of the enlarged portion 25 of stud 13 and be sealed thereto, as by soldering or brazing. An insulating cap of material such as glass or ceramic is provided as a closure for the upper part of the cylindrical metal portion 27 for the purpose of holding a cathode tubulation 31 and a gate tubulation 30 and to insulate these tubulations from the stud 13 (anode lead) when the device is assembled. The cathode and gate leads 12 and 14 respectively are brought up in their respective tubulations 31 and 30. After the housing is evacuated, the tubulations 31 and 30 are pinched off to form good electrical connections with the leads (12 and 14) pressed therein and to form the device cathode and gate terminals 11 and 15 respectively.

Thus, it is seen that the objects of the invention have been carried out by providing contact means which prevent penetration and fracturing of the semiconductor pellet by the bonding materials, provides control of the flow and penetration of bonding materials during device fabrication and offers high resistance to acid etchants.

While a particular embodiment of the invention has been shown and described it will, of course, be understood that the invention is not limited thereto since many modifications varied to fit particular operating requirements and environments will be apparent to those skilled in the art. The invention may be used to perform similar functions and its peculiar properties taken advantage of in other semiconductor devices utilizing other materials than those described without departing from the concept of the invention. Accordingly, the invention is not considered limited to the examples chosen for the purposes of disclosure and it is contemplated that the appended claims will cover any such modifications as fall within the true spirit and scope of the invention.

What we claim as new and desire to secure by Letters Patent of the United States is:

1. A semiconductor device of the rectifying junction type requiring external electrical connection thereto including a body of semiconductor material, and contact means secured to said body of semiconductor material, said contact means including a layer of nickel bonded directly to said body of semiconductor material, a layer of copper bonded directly to said layer of nickel, and a layer of gold bonded directly to said layer of copper.

2. A semiconductor device including in combination a body of semiconductor material, contact means secured to said semiconductor body, and an electrical lead connected to said contact means, said contact means including a layer of nickel bonded directly to said body of semiconductor material, a layer of copper bonded directly to said layer of nickel, and a layer of gold bonded directly to said layer of copper.

3. A semiconductor device of the type requiring external electrical connection thereto including a body of semiconductor material having two major faces and contact means secured to said two major faces, said contact means including a layer of nickel bonded directly to said body of semiconductor material, a layer of copper bonded directly to said layer of nickel, and a layer of gold bonded directly to said layer of copper.

References Cited by the Examiner

UNITED STATES PATENTS

| | | | |
|---|---|---|---|
| 1,001,669 | 8/1911 | Monnot | 29—199 |
| 2,790,940 | 4/1957 | Prince | 317—234 |

References Cited by the Applicant

UNITED STATES PATENTS

| | | | |
|---|---|---|---|
| 2,820,932 | 1/1958 | Looney. | |

HYLAND BIZOT, *Primary Examiner.*